(12) United States Patent
Nagatomo

(10) Patent No.: US 7,568,574 B2
(45) Date of Patent: Aug. 4, 2009

(54) SUBSTRATE TRANSPORTATION METHOD AND APPARATUS

(75) Inventor: Kazuya Nagatomo, Kanagawa (JP)

(73) Assignee: NEC LCD Technologies, Kanagawa (JP)

( * ) Notice: Subject to any disclaimer, the term of this patent is extended or adjusted under 35 U.S.C. 154(b) by 271 days.

(21) Appl. No.: 11/798,090

(22) Filed: May 10, 2007

(65) Prior Publication Data
US 2007/0281449 A1   Dec. 6, 2007

(30) Foreign Application Priority Data
May 17, 2006   (JP)   .............................. 2006-137412

(51) Int. Cl.
*B65G 47/22* (2006.01)
(52) U.S. Cl. ..................... 198/493; 198/689.1
(58) Field of Classification Search ................. 198/493, 198/689.1, 780, 782, 781.09, 790; 193/35 R, 193/37
See application file for complete search history.

(56) References Cited

U.S. PATENT DOCUMENTS

| | | | | |
|---|---|---|---|---|
| 2,773,433 A | * | 12/1956 | Mathias | ........................ 193/37 |
| 3,701,412 A | * | 10/1972 | Wriedt | ...................... 198/689.1 |
| 4,664,166 A | * | 5/1987 | Benisti | ...................... 198/689.1 |
| 5,111,930 A | * | 5/1992 | Ginzburg et al. | ............. 198/780 |
| 6,131,214 A | * | 10/2000 | Moenning et al. | .............. 193/37 |
| 6,363,753 B1 | * | 4/2002 | Yoshizawa et al. | ............. 193/37 |

FOREIGN PATENT DOCUMENTS

| | | |
|---|---|---|
| JP | 07-014819 | 1/1995 |
| JP | 2000-015187 | 1/2000 |
| JP | 2002-022359 | 1/2002 |
| JP | 2003-229404 | 8/2003 |

* cited by examiner

Primary Examiner—James R Bidwell
(74) Attorney, Agent, or Firm—Young & Thompson

(57) ABSTRACT

The substrate transportation apparatus 10 comprises a plurality of transportation rollers 22A-22D disposed at a predetermined spacing for transporting the substrate 40 in response to rotation of the transportation rollers 22. Each of the transportation rollers 22 is generally hollow cylindrical member formed with a plurality of slit nozzles 24 in the circumference. Alternating rows of the transportation rollers 22 are designed to blow and suck air to and from the bottom surface of the substrate 40 under transportation while preventing dust or any other foreign materials from collecting on the bottom surface of the substrate 40.

13 Claims, 2 Drawing Sheets

SUBSTRATE TRANSPORTATION METHOD AND APPARATUS

BACKGROUND OF THE INVENTION

This application claims benefits of Japanese Patent Application No. 2006-137412 filed on May 17, 2006, the contents of which are incorporated by the references.

The present invention relates to a substrate transportation method and apparatus, more specifically to a method and an apparatus for transporting a substrate such as a glass plate to be used in fabrication of an electronic device such as a liquid crystal display panel (LCD), a semiconductor integrated device (IC) or the like from one location to another while removing dust or any other foreign materials attached to or collected on the back surface of such substrate.

Electronic devices such as color liquid crystal display panels or the like are generally fabricated through a series of fabrication steps such as masking, photo lithography, etching, bonding and the like for fabricating on the front surface of such substrate semiconductor devices that drive pixels of such display devices. For this end, a substrate is automatically transported by a substrate transportation apparatus from one location to another in the fabrication process of such electronic devices. Such substrate becomes increasingly larger in size as the display device becomes larger and also for the purpose of reducing production cost per device.

In such electronic devices, attachment of dust or any other foreign materials on the surface of such substrate results in defective pixels or semiconductor devices for driving such pixels, thereby determining quality, production yield (or productivity), production cost and the like of the fabricated electronic device. Accordingly, in order to improve productivity and production cost of such electronic device, it is essential to prevent dust or any other foreign materials from attaching to the substrate surface or to minimize dust or any other foreign materials on the substrate surface.

A main cause of collecting dust or any other foreign materials on the surface of the substrate for such electronic device is understood to be transportation of such substrate from one place to another in the fabrication process. If dust or any other foreign materials attaches on the substrate surface during transportation, such dust or any other foreign materials attaches to the surface of adjacent substrate when they are stacked. It is therefore desirable to develop a substrate transportation method and apparatus capable of transporting a substrate to be used for fabrication of electronic devices so that no dust or any other foreign materials attach to the surface of the substrate under transportation.

There are some publications disclosing conventional technologies of transporting a substrate while preventing dust or any other foreign materials from attaching to the substrate surface or minimizing dust or any other foreign materials on the substrate surface. For example, Japanese patent publication no. 2000-15187 discloses a foreign material removing apparatus for transporting a substrate on transportation rollers, in which foreign materials attached to the bottom surface of such substrate are wiped off by a first rotary brush, a second rotary brush is disposed below the first rotary brush for knocking for more completely removing foreign materials attached to the substrate.

Japanese patent publication no. 2002-22359 discloses a dryer for spraying air knife onto the bottom surface of a substrate that is being transported on transportation roller for removing liquid attached to the substrate, thereby drying the substrate. Moreover, Japanese patent publication no. 2003-229404 discloses a substrate processing apparatus for sucking mist from a substrate surface and also exhausting such mist for preventing it from attaching to the substrate when the substrate passes through upper and lower air knives in a substrate transportation path, thereby improving substrate processing quality. Additionally, Japanese patent publication no. 7-14819 discloses a substrate dryer in which a down-flow is generated in a substrate drying process by an air knife in a clean unit for exhausting impurities from an outlet, thereby preventing such impurities from attaching to the substrate.

However, such conventional technologies as described hereinabove require relatively complicated, bulky and expensive apparatus for removing dust or any other foreign materials from the bottom surface of the substrate. It is also difficult to effectively remove foreign materials from the substrate under transportation.

SUMMARY OF THE INVENTION

In view of the above problems associated with prior art, it is an object of the present invention to provide a relatively simple, compact and less expensive substrate transportation method and apparatus that is capable of effectively removing dust or any other foreign materials attached to the bottom surface of the substrate under transportation, thereby improving productivity and performance of the electronic device fabricated by employing such substrate. It is to be noted that the term "substrate" means in this specification any thin plate member preferably used for, but not limited to, fabrication of electronic devices.

In order to overcome the aforementioned problems and achieve the above object, the substrate transportation method and apparatus according to the present invention employ featured constructions as follows:

According to an aspect of the present invention, there is provided a substrate transportation apparatus for transporting a substrate having desired width and length by rotating a plurality of transportation rollers disposed at a desired spacing in the longitudinal direction of the substrate, characterized in that: the transportation rollers are formed with nozzles for alternately blowing and sucking gas from adjacent transportation rollers onto and from the bottom surface of the substrate while the transportation rollers are rotating.

Each of the transportation rollers is a hollow cylindrical member having a continuously varying diameter in the longitudinal direction and the nozzles consist of a plurality of slits formed in the circumference of the cylindrical member. Each of the transportation rollers has a plurality of narrow maximum diameter portions in the longitudinal direction to contact with the substrate at plural locations in the width direction of the substrate. Intake and discharge tubes of a blower fan are alternatively coupled to the plurality of transportation rollers disposed in the transportation direction of the substrate.

According another aspect of the present invention, there is provided a substrate transportation apparatus for transporting a substrate having desired width and length in a predetermined direction, comprising: a substrate transportation section including a plurality of generally cylindrical transportation rollers rotating at a desired speed and disposed at a desired spacing in the transportation direction of the substrate, each of the transportation rollers being formed with a plurality of slits in the circumference; and a gas blowing/sucking section coupled to the plurality of transportation rollers for alternately blowing and sucking gas from the slits to and from the substrate.

The slits in the circumference of each of the plurality of transportation rollers are formed in a staggered configuration.

The gas blowing/sucking section utilizes intake and discharging gas from a common blower fan. A filter is provided in a tube of the gas blowing/sucking section for removing foreign materials in the air from the blower fan before being blown to the substrate. The substrate transportation apparatus further comprises a frame for covering the bottom and sides of the plurality of transportation rollers.

According other aspect of the present invention, there is provided a substrate transportation method for transporting a substrate from one location to another, comprising the steps of: providing plural rows of generally cylindrical transportation rollers at a desired spacing in the direction of transporting the substrate; and blowing and sucking air from nozzles in alternating rows of the transportation rollers to and from the bottom surface of the substrate while the transportation rollers are rotating.

The substrate transportation method further comprises the step of continuously varying the outer diameter of each of the transportation rollers in a wave shape to minimize the contact area with the substrate to be transported.

According to still other aspect of the present invention, there is provided a substrate transportation method for transporting a substrate on a plurality of transportation rollers disposed in plural rows in the transportation direction of the substrate, comprising the steps of: forming slit nozzles in the circumferential surfaces of the transportation rollers; coupling discharge air from a blower fan to odd rows of the transportation rollers to blow air from the slit nozzles onto the bottom surface of the substrate; and coupling intake air of the blower fan to even rows of the transportation rollers to suck air from the slit nozzles below the substrate.

The substrate transportation method further comprises the step of covering the bottom and sides of the transportation rollers with a frame.

The substrate transportation method and apparatus according to the present invention exhibit the following practical advantages. Since transportation rollers in the substrate transportation section are provided with an air blowing/sucking portion integrally with the transportation rollers for blowing and sucking gas (e.g., air), it is possible to effectively remove dust or any other foreign materials from the substrate surface with relatively simple, compact and less expensive construction. Moreover, since slit nozzles are formed with a plurality of transportation rollers disposed in plural rows at a constant distance in the substrate transporting direction for alternately blowing and sucking gas, dust or any other foreign materials blown by the air-flow from slit nozzles in a staggered configuration in one transportation roller is sucked in the immediately adjacent transportation rollers, thereby effectively removing dust or any other foreign materials on the substrate surface.

Additionally, the use of discharging and intake gases in blowing and sucking tubes from a common blower fan enables to easily and inexpensively remove dust or any other foreign materials from the substrate surface. It is also possible that the filter in the air-blow tube prevents dust in the circulating gas (e.g., air) from reattaching to the substrate surface. Since each transportation roller is designed to continuously change its diameter in the width direction of the substrate under transportation, the contacting area with the substrate surface is minimized, thereby minimizing the possibility of collecting dust or any other foreign materials on the substrate surface.

BRIEF DESCRIPTION OF THE DRAWINGS

In the accompanying drawings.

DESCRIPTION OF PREFERRED EMBODIMENT

Now, the construction and operation of a preferred embodiment of the substrate transportation method and apparatus according to the present invention will be described in detail with reference to the accompanying drawings.

Figure 1:
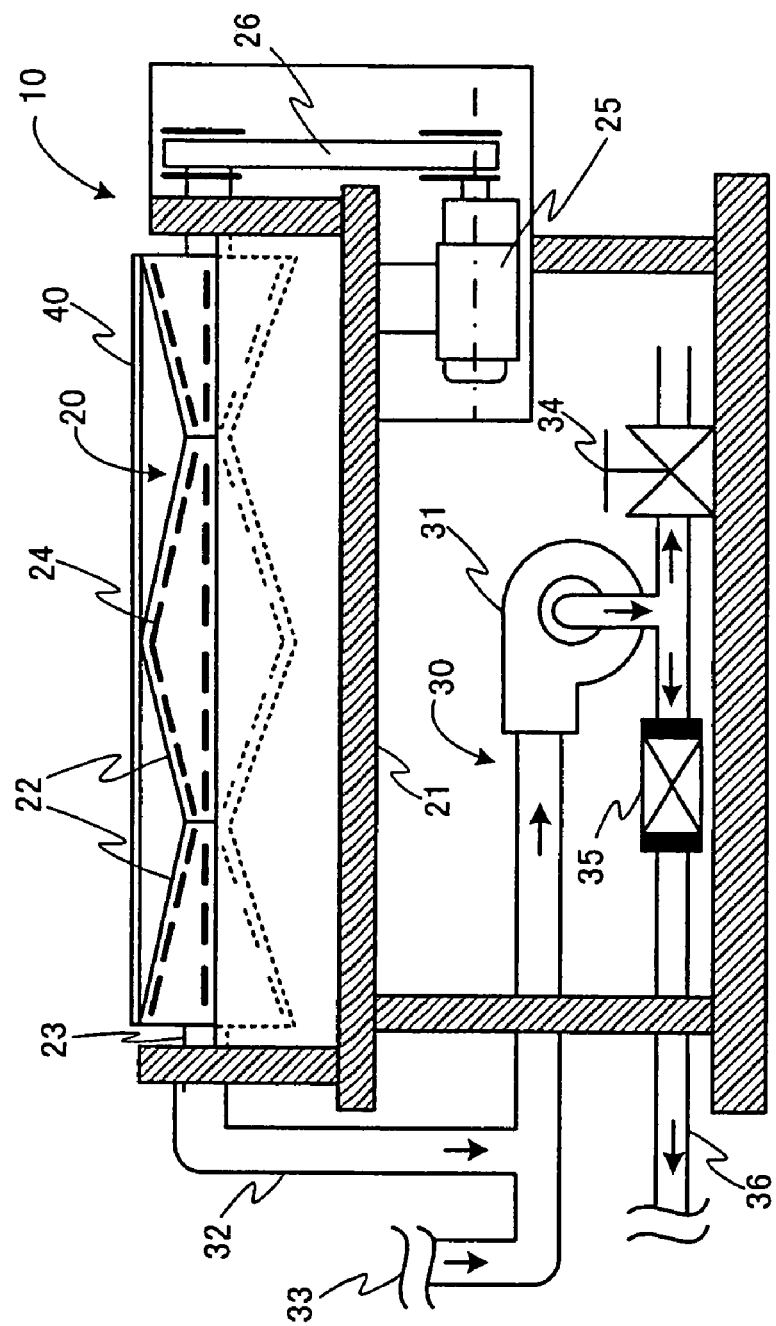
FIG. 1 is a simplified partially cross section side view of a preferred embodiment of the substrate transportation apparatus according to the present invention.

Firstly, a reference is made with FIG. 1 illustrating the partially cross section side view of a preferred embodiment of the substrate transportation apparatus according to the present invention. The substrate transportation apparatus 10 comprises primarily a substrate transportation section 20 and a gas blowing/sucking section (referred to as an air blowing/sucking section below) 30. As will be described hereinafter in detail, a substrate 40, i.e., a thin plate member such as a glass substrate or the like is transported in the direction vertical to the sheet of FIG. 1.

The substrate transportation section 20 comprises a plurality of transportation rollers 22 through which respective rotary shafts 23 extend. Each rotary shaft 23 extends through both sidewalls of a frame (or block) 21 that covers the bottom surface and the sides of the substrate transportation section 20. As will be described hereinafter, the transportation rollers 22 are disposed in plural rows at a constant spacing along the transportation (or longitudinal) direction of the substrate 40. Each rotary shaft 23 is driven by a respective transportation motor 25 to rotate at a desired rotary speed by way of a timing belt 26. It is to be noted that known bearings (not shown) are provided between the rotary shaft 23 and sidewalls of the frame 21 for smooth rotation of the respective transportation roller 22. If necessary, by adjusting the rotary speed and the direction of rotation of the transportation motor 25, it is possible to control the transportation speed and direction of the substrate 40.

Each of the transportation rollers 22 is preferably a generally hollow cylindrical member having a continuously varying diameter along the longitudinal direction. In other words, the diameter of each transportation roller 22 changes substantially linearly and continuously along the rotary shaft 23. Each transportation roller 22 contacts with the bottom surface of the substrate 40 under transportation with the minimum contact area only at the maximum diameter portions and the substrate 40 is transported in a predetermined direction in response to the rotation of the transportation rollers 22. As best shown in FIG. 1, each transportation roller 22 is formed with a large number of slits (or slit nozzles) 24 in a staggered configuration in the outer circumference.

On the other hand, the air blowing/sucking section 30 comprises a blower fan 31, tubes 32 and 33 between the blower fan 31 and the transportation rollers 22, an adjustment valve 34, a filter (HEPA filter) 35 and an air-blow tube 36.

Figure 2:
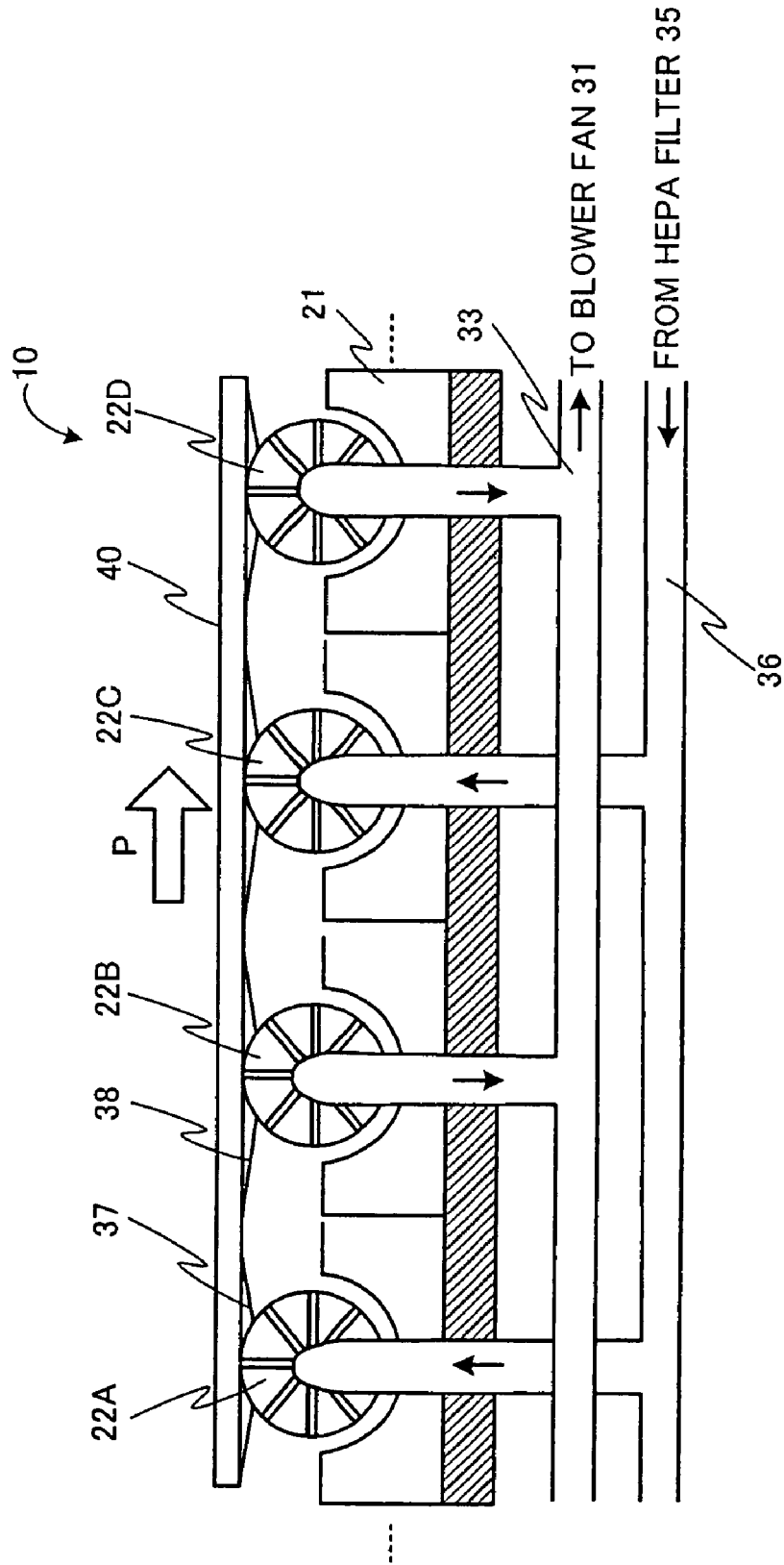
FIG. 2 is a cross section view of the substrate transportation apparatus in FIG. 1 in the substrate transportation direction.

Now, the relationship between the substrate transportation section 20 and the air blowing/sucking section 30 of the substrate transportation apparatus 10 according to the present invention as shown in FIG. 1 will be described in detail with reference to FIG. 2 illustrating a cross section view in the perpendicular direction relative to FIG. 1. In the particular example as shown in FIG. 2, the substrate 40 is transported from left to right direction in FIG. 2 as indicated by an arrow P.

As understood from FIGS. 1 and 2, the transportation rollers 22A-22D are disposed in plural rows at a predetermined spacing in response to the width and length of the substrate 40 as well as the transportation distance. The transportation rollers 22A-22D are designed so that air is alternately blown onto the substrate surface and sucked therefrom. That is, the air-blow tube 36 from the filter 35 is coupled to, for example, the even rows of the transportation rollers 22A and 22C (the first and third rows in this example), while the air sucking tube 32 leading to the blower fan 31 is coupled to the even rows of the transportation rollers 22B and 22D (the second and fourth rows in this example). It is to be noted that each transportation roller 22 may be in form of a series of cones or a wave shape as shown in FIG. 1 so that air is blown from the slit nozzles 24 onto wider areas of the substrate 40. The same is true with sucking of blown air by the adjacent transportation rollers.

Further description will be made on the substrate transportation apparatus according to the present invention with reference to FIGS. 1 and 2. The substrate 40 is transported in one direction (as indicated by the arrow P in FIG. 2) by the transportation rollers 22 in the substrate transportation section 20. The sucking tube 32 is coupled to a selected transportation roller (e.g., the transportation roller 22B) and transports air sucked from the slit nozzles 24 to the blower fan 31. On the other hand, the tube 33 is coupled to another transportation roller (e.g., transportation roller 22D) and transports the sucked air back to the blower fun 31. The blower fan 31 is a power source for sucking or blowing air. The timing belt 26 is coupled to the respective transportation motor 25 for rotating the respective transportation roller 22. The transportation motors 25 are power sources for rotating the transportation rollers 22. The valve 34 is designed for adjusting (e.g., by manually) the amount of airflow to blow or suck from the slit nozzles 24 in the transportation rollers 22.

The filter (HEPA filter) 35 is provided for removing dust or any other foreign materials in the air sucked from the slit nozzles 24. The air-blow tube 36 is designed to supply air to be blown out of the slit nozzles 24. The frame 21 is provided to efficiently blow or suck air onto or out of the bottom surface of the substrate 40 by closing the bottom area of the substrate 40, thereby essentially sealing slit nozzles 24 at remote locations from the bottom surface of the substrate 40. A blowing air 37 represents airflow that blows out of the slit nozzles 24, for example, in the transportation rollers 22A and 22C. On the other hand, a sucking air 38 represents airflow that sucks into the slit nozzles 24, for example, in the transportation rollers 22B and 22D.

Now, the operation of the preferred embodiment of the substrate transportation apparatus 10 according to the present invention will be described with reference to FIGS. 1 and 2.

Each transportation roller 22 is coupled to the respective transportation motor 25 by way of the timing belt 26, thereby rotating the transportation roller 22 by the power of the transportation motor 25. By the rotation of the transportation rollers 22, the substrate 40 is transported at a speed and in a direction determined by the rotary speed and direction of the transportation motors 25. Each transportation roller 22 is formed with the slit nozzles 24 preferably in a staggered configuration. Such slit nozzles 24 have the following dual functions. Firstly, by supplying air from the inside of the respective rotary shaft 23, the bottom surface of the substrate 40 is blown by the air. Secondly, dust or any other foreign materials contained in the blown air by removing from the surface of the substrate 40 is sucked by way of the rotary shaft 23.

As best shown in FIG. 2, the transportation rollers (e.g., 22A and 22C) that provide air blow onto the bottom surface of the substrate 40 and the transportation rollers (e.g., 22B and 22D) that suck air in the area near the bottom surface of the substrate 40 are alternately disposed at a predetermined spacing in the transportation direction of the substrate 40, thereby enabling to remove dust or any other foreign materials by the air-blow onto the bottom surface of the substrate 40 under transportation and to suck the removed dust or any other foreign materials. Moreover, any air unnecessary for removing dust or any other foreign materials on the bottom surface of the substrate 40 is shut off by covering the bottom and sides of the transportation rollers 22 with the frame 21, thereby improving performance of removing dust or any other foreign materials. Since the transportation rollers 22 blow air from the slit nozzles 24 in a staggered configuration while rotating, it is possible to substantially uniformly blow air onto the bottom surface of the substrate 40.

It is to be noted that the single blower fan 31 is commonly used as an air circulation mechanism for blowing and sucking air and that the air sucking performance can be adjusted, if necessary, by inverter controlling the blower fan 31. The air blowing performance can also be controlled by, for example, manually adjusting the valve 34 that adjusts the discharging air from the blower fan 31. Since the sucked air is blown again onto the bottom surface of the substrate 40 through the HEPA filter 35, dust or any other foreign materials is effectively removed before being blown again onto the bottom surface of the substrate 40.

As apparent from the above description, another aspect of the present invention is the substrate transportation method for transporting the substrate on a plurality of transportation rollers. It features in that the transportation rollers are disposed in plural rows in the substrate transportation direction and air is blown from odd rows of transportation rollers onto the bottom surface of the substrate under transportation, while sucking the air from the even rows of transportation rollers. Such unique substrate transportation method enables to transport the substrate from one location to another location with essentially no dust or any other foreign materials collecting on the bottom surface of the substrate under transportation.

The construction and operation of the preferred embodiment of the substrate transportation method and apparatus according to the present invention have been described in greater detail. It is to be noted, however, that the embodiment is nothing but an example of the present invention rather than restricting the scope of the invention. It is apparent that a person having an ordinary skill in the art is able to make various modifications without departing the scope and spirit of the present invention.

For example, although gas (air) is used for removing foreign materials collected on the bottom surface of the substrate in the preferred embodiment, gas may be replaced by any liquid such as washing liquid while maintaining similar results and advantages. In case of making a surface treatment of a substrate (for example, brushing the surface) while transporting the substrate by the transportation rollers, the substrate may not be properly transported without employing any hold-down means. It is possible to convert the slit nozzles of the entire transportation rollers into sucking nozzles for such particular applications.

As apparent from the above descriptions, the substrate transportation apparatus according to the present invention is particularly useful for transporting large substrates to be used for fabrication of large scale liquid crystal display panels, semiconductor integrated circuits, etc.

What is claimed is:

1. A substrate transportation apparatus for transporting a substrate having desired width and length by rotating a plurality of transportation rollers disposed at a desired spacing in the longitudinal direction of the substrate, characterized in that:

the transportation rollers are formed with nozzles for alternately blowing and sucking gas from adjacent transportation rollers onto and from the bottom surface of the substrate while the transportation rollers are rotating.

2. A substrate transportation apparatus of claim 1, wherein each of the transportation rollers is a hollow cylindrical member having a continuously varying diameter in the longitudinal direction and the nozzles consist of a plurality of slits formed in the circumference of the cylindrical member.

3. A substrate transportation apparatus of claim 1, wherein each of the transportation rollers has a plurality of narrow maximum diameter portions in the longitudinal direction to contact with the substrate at plural locations in the width direction of the substrate.

4. A substrate transportation apparatus of claim 1, wherein intake and discharge tubes of a blower fan are alternatively coupled to the plurality of transportation rollers disposed in the transportation direction of the substrate.

5. A substrate transportation apparatus for transporting a substrate having desired width and length in a predetermined direction, comprising:

a substrate transportation section including a plurality of generally cylindrical transportation rollers rotating at a desired speed and disposed at a desired spacing in the transportation direction of the substrate, each of the transportation rollers being formed with a plurality of slits in the circumference; and a gas blowing/sucking section coupled to the plurality of transportation rollers for alternately blowing and sucking gas from the slits to and from the substrate.

6. A substrate transportation apparatus of claim 5, wherein the slits in the circumference of each of the plurality of transportation rollers are formed in a staggered configuration.

7. A substrate transportation apparatus of claim 5, wherein the gas blowing/sucking section utilizes intake and discharging gas from a common blower fan.

8. A substrate transportation apparatus of claim 5, further comprising a filter is provided in a tube of the gas blowing/sucking section for removing foreign materials in the air from the blower fan before being blown to the substrate.

9. A substrate transportation apparatus of claim 5, further comprising a frame for covering the bottom and sides of the plurality of transportation rollers.

10. A substrate transportation method for transporting a substrate from one location to another, comprising the steps of:

providing plural rows of generally cylindrical transportation rollers at a desired spacing in the direction of transporting the substrate; and blowing and sucking air from nozzles in alternating rows of the transportation rollers to and from the bottom surface of the substrate while the transportation rollers are rotating.

11. A substrate transportation method of claim 10, further comprising the step of continuously varying the outer diameter of each of the transportation rollers in a wave shape to minimize the contact area with the substrate to be transported.

12. A substrate transportation method for transporting a substrate on a plurality of transportation rollers disposed in plural rows in the transportation direction of the substrate, comprising the steps of:

forming slit nozzles in the circumferential surfaces of the transportation rollers;

coupling discharge air from a blower fan to odd rows of the transportation rollers to blow air from the slit nozzles onto the bottom surface of the substrate; and coupling intake air of the blower fan to even rows of the transportation rollers to suck air from the slit nozzles below the substrate.

13. A substrate transportation method of claim 12, further comprising the step of covering the bottom and sides of the transportation rollers with a frame.

* * * * *